(12) United States Patent
Newbery et al.

(10) Patent No.: US 8,709,548 B1
(45) Date of Patent: Apr. 29, 2014

(54) METHOD OF MAKING A CIG TARGET BY SPRAY FORMING

(75) Inventors: A. Piers Newbery, Santa Clara, CA (US); Timothy Kueper, Santa Clara, CA (US); Daniel R. Juliano, Santa Clara, CA (US)

(73) Assignee: Hanergy Holding Group Ltd., Beijing (CN)

( * ) Notice: Subject to any disclaimer, the term of this patent is extended or adjusted under 35 U.S.C. 154(b) by 623 days.

(21) Appl. No.: 12/907,783

(22) Filed: Oct. 19, 2010

Related U.S. Application Data (60) Provisional application No. 61/272,681, filed on Oct. 20, 2009.

(51) Int. Cl.
*B05D 1/02* (2006.01)

(52) U.S. Cl.
USPC ........ 427/421.1; 136/265; 136/262; 427/524; 438/604; 438/687; 438/102; 438/95; 106/1.18

(58) Field of Classification Search
USPC .............. 136/252, 265, 262; 427/421.1, 524; 438/604, 687, 102, 95; 106/1.18
See application file for complete search history.

(56) References Cited

U.S. PATENT DOCUMENTS

| | | |
|---|---|---|
| 3,902,544 A | 9/1975 | Flemings et al. |
| 3,948,650 A | 4/1976 | Flemings et al. |
| 4,089,680 A | 5/1978 | Flemings et al. |
| 4,103,730 A | 8/1978 | Dussart |
| 4,150,712 A | 4/1979 | Dussart |
| 4,178,979 A | 12/1979 | Birat et al. |
| 4,200,137 A | 4/1980 | Zavaras et al. |
| 4,229,210 A | 10/1980 | Winter et al. |
| 4,356,073 A | 10/1982 | McKelvey |
| 5,302,414 A | 4/1994 | Alkhimov et al. |
| 5,343,926 A * | 9/1994 | Cheskis et al. ................. 164/46 |
| 5,401,539 A * | 3/1995 | Coombs et al. ............... 427/422 |
| 5,435,965 A | 7/1995 | Mashima et al. |
| 5,522,535 A | 6/1996 | Ivanov et al. |
| 5,626,688 A | 5/1997 | Probst et al. |
| 5,699,850 A | 12/1997 | Beitelman et al. |
| 5,814,195 A | 9/1998 | Lehan et al. |
| 5,904,966 A | 5/1999 | Lippens |
| 6,020,556 A | 2/2000 | Inaba et al. |
| 6,070,643 A | 6/2000 | Colvin |
| 6,310,281 B1 | 10/2001 | Wendt et al. |
| 6,372,538 B1 | 4/2002 | Wendt et al. |

(Continued)

FOREIGN PATENT DOCUMENTS

| | | |
|---|---|---|
| DE | 69835851 T2 | 4/2007 |
| EP | 881695 A2 | 12/1998 |
| JP | 2009-120862 A | 6/2009 |
| JP | 2009-120863 A | 6/2009 |

OTHER PUBLICATIONS

Sodium Selenide, MSDS, ChemicalBook, 2007.*

(Continued)

*Primary Examiner* — Timothy Meeks
*Assistant Examiner* — Nathan T Leong
(74) *Attorney, Agent, or Firm* — The Marbury Law Group PLLC (57) ABSTRACT

A method of making a sputtering target includes providing a backing structure, and forming a copper indium gallium sputtering target material on the backing structure by spray forming.

22 Claims, 6 Drawing Sheets

(56) References Cited

U.S. PATENT DOCUMENTS

| | | |
|---|---|---|
| 6,478,842 B1 | 11/2002 | Gressel et al. |
| 6,500,733 B1 | 12/2002 | Stanbery |
| 6,525,264 B2 | 2/2003 | Ouchida et al. |
| 6,559,372 B2 | 5/2003 | Stanbery |
| 6,593,213 B2 | 7/2003 | Stanbery |
| 6,690,041 B2 | 2/2004 | Armstrong et al. |
| 6,722,584 B2 | 4/2004 | Kay et al. |
| 6,736,986 B2 | 5/2004 | Stanbery |
| 6,739,384 B2 | 5/2004 | Schoen et al. |
| 6,750,394 B2 | 6/2004 | Yamamoto et al. |
| 6,787,692 B2 | 9/2004 | Wada et al. |
| 6,797,874 B2 | 9/2004 | Stanbery |
| 6,822,158 B2 | 11/2004 | Ouchida et al. |
| 6,852,920 B2 | 2/2005 | Sager et al. |
| 6,878,612 B2 | 4/2005 | Nagao et al. |
| 6,881,647 B2 | 4/2005 | Stanbery |
| 6,936,761 B2 | 8/2005 | Pichler |
| 6,987,071 B1 | 1/2006 | Bollman et al. |
| 7,045,205 B1 | 5/2006 | Sager |
| 7,115,304 B2 | 10/2006 | Roscheisen et al. |
| 7,122,392 B2 | 10/2006 | Morse |
| 7,122,398 B1 | 10/2006 | Pichler |
| 7,141,449 B2 | 11/2006 | Shiozaki |
| 7,148,123 B2 | 12/2006 | Stanbery |
| 7,163,608 B2 | 1/2007 | Stanbery |
| 7,194,197 B1 | 3/2007 | Wendt et al. |
| 7,196,262 B2 | 3/2007 | Gronet |
| 7,227,066 B1 | 6/2007 | Roscheisen et al. |
| 7,235,736 B1 | 6/2007 | Buller et al. |
| 7,247,346 B1 | 7/2007 | Sager et al. |
| 7,253,017 B1 | 8/2007 | Roscheisen et al. |
| 7,259,322 B2 | 8/2007 | Gronet |
| 7,262,392 B1 | 8/2007 | Miller |
| 7,267,724 B2 | 9/2007 | Tanaka et al. |
| 7,271,333 B2 | 9/2007 | Fabick et al. |
| 7,291,782 B2 | 11/2007 | Sager et al. |
| 7,306,823 B2 | 12/2007 | Sager et al. |
| 7,319,190 B2 | 1/2008 | Tuttle |
| 7,374,963 B2 | 5/2008 | Basol |
| 7,544,884 B2 | 6/2009 | Hollars |
| 7,637,441 B2 | 12/2009 | Heinrich et al. |
| 7,785,921 B1 | 8/2010 | Juliano et al. |
| 7,833,821 B2 | 11/2010 | Basol |
| 2002/0033135 A1 | 3/2002 | Kay et al. |
| 2005/0109392 A1* | 5/2005 | Hollars ............ 136/265 |
| 2005/0194036 A1* | 9/2005 | Basol ............ 136/252 |
| 2005/0202589 A1* | 9/2005 | Basol ............ 438/102 |
| 2007/0074969 A1 | 4/2007 | Simpson et al. |
| 2007/0093059 A1* | 4/2007 | Basol ............ 438/687 |
| 2007/0283996 A1 | 12/2007 | Hachtmann et al. |
| 2007/0283997 A1 | 12/2007 | Hachtmann et al. |
| 2008/0000518 A1 | 1/2008 | Basol |
| 2008/0053519 A1 | 3/2008 | Pearce et al. |
| 2008/0105542 A1 | 5/2008 | Purdy et al. |
| 2008/0121137 A1* | 5/2008 | van Osten et al. ........ 106/1.18 |
| 2008/0142071 A1 | 6/2008 | Dorn et al. |
| 2008/0145692 A1 | 6/2008 | Ziani |
| 2008/0271779 A1 | 11/2008 | Miller et al. |
| 2008/0271781 A1 | 11/2008 | Kushiya et al. |
| 2008/0314432 A1 | 12/2008 | Paulson et al. |
| 2009/0014049 A1 | 1/2009 | Gur et al. |
| 2009/0014057 A1 | 1/2009 | Croft et al. |
| 2009/0014058 A1 | 1/2009 | Croft et al. |
| 2009/0199894 A1 | 8/2009 | Hollars et al. |
| 2009/0223556 A1 | 9/2009 | Niesen et al. |
| 2010/0116341 A1 | 5/2010 | Huang et al. |
| 2010/0133093 A1 | 6/2010 | Juliano et al. |
| 2010/0136242 A1 | 6/2010 | Kay et al. |
| 2010/0212732 A1 | 8/2010 | Schmidt |
| 2010/0212733 A1 | 8/2010 | Schmidt |
| 2011/0089030 A1 | 4/2011 | Juliano et al. |

OTHER PUBLICATIONS

Al-Trans™ Zinc Chromate Replacement, High Frequency Grounding, Inovati.com, 2012.
Al-Trans™ IVD Field Repair, nano Al-Trans® (Al based composite), Inovati.com, 2012.
Al-Trans™ Mild Steel Outside Cabinets, Al-Trans® (Corrosion Protection), Inovati.com, 2012.
Kinetic Metallization of Conformal Antenna and Electronics, KM Conformal Antenna Aperstructures, Inovati.com, 2012.
MCrAIY Coatings, MCrAIY, Inovati.com, 2012.
Kinetic Metallization of High Performance Polymers, High-Performance Paint Alternative, Inovati.com, 2012.
Bodegård et al., "The influence of sodium on the grain structure of CuInSo$_2$ films for photovoltaic applications," 12th European Photovoltaic Solar Energy Conference, Proceedings of the International Conference, Amsterdam, The Netherlands, Apr. 11-15, 1994, Hill et al. Ed., vol. II, 1743-1746.
Contreras et al., "On the role of Na and modifications to Cu(In,Ga)Se$_2$ absorber materials using thin-MF (M=Na, K, Cs) precursor layers," $26^{th}$ IEEE PVSC, Anaheim, California, Sep. 30-Oct. 3, 1997, 359-362.
Department of Defense, Manufacturing Process Standard, Materials Desposition, Cold Spray, MIL-STD-3021, Aug. 4, 2008.
Devaney et al., "Recent improvement in CuInSe$_2$ /ZnCdS thin film solar cell efficiency," 18th IEEE Photovoltaic Spec. Conf., 1985, New York, 1733-1734.
Evbuomwan et al., "Concurrent materials and manufacturing process selection in design function deployment," Concurrent Engineering: Research and Applications, Jun. 1995, 3(2):135-144.
Gabel, H. Kinetic Metallization Compared with HVOF, Advanced Materials & Processes, May 2004, ASM International, Metals Park, OH, pp. 47-48.
Granath et al., "Mechanical issues of NO back contracts for Cu(In,Ga)Se$_2$ devices," 13th European Photovoltaic Solar Energy Conference, Proceedings of the International Conference, Nice, France, Oct. 23-27, 1995, Freiesleben et al. Ed., vol. II, 1983-1986.
Hedström et al., "ZnO/CdS/Cu(In,Ga)Se$_2$ thin film solar cells with improved performance," $23^{th}$ IEEE Photovoltaic Specialists Conference, Louisville, Kentucky, May 10-14, 1993, 364-371.
Holz et al., "The effect of substrate impurities on the electronic conductivity in CIS thin films," $12^{th}$ European Photovoltaic Solar Energy Conference, Proceedings of the International Conference, Amsterdam, The Netherlands, Apr. 11-15, 1994, Hill et al. Ed., vol. II, 1592-1595.
Inovati, Kinetic Metallization™ Equipment, KM Data Sheet, Form MCP4-11, 2011, 1 pg.
Irissou et al., "Review on Cold Spray Process and Technology: Part I—Intellectual Property," J. of Thermal Spray Tech., vol. 17(4), pp. 495-516, Dec. 2008.
Mickelsen et al., "High photocurrent polycrystalline thin-film CdS/CuInSe$_2$ solar cell," Appl. Phys. Lett., Mar. 1, 1980, 36(5):371-373.
Mohamed et al., "Correlation between structure, stress and optical properties in direct current sputtered molybdenum oxide films," Thin Solid Films, 2003, 429:135-143.
Probst et al., "The impact of controlled sodium incorporated on rapid thermal processed Cu(InGa)Se$_2$-thin films and devices," First WCPEC, Hawaii, Dec. 5-9, 2004, 144-147.
Ramanath et al., "Properties of 19.2% Efficiency ZnO/CdS/CuInGaSe$_2$ Thin-film Solar Cells," Progress in Photovoltaics: Research and Applications, 2003, 11:225-230.
Rau et al., "Cu(ln,Ga)Se$_2$ solar cells," Clean Electricity From Photovoltaics, Series on Photoconversion of Solar Energy, vol. 1, 2001, Archer et al. Ed., Chapter 7, 277-345.
Robinson, T., "Coatings: Kinetic Metallization," 2004 MDA Technology Applications Report, pp. 36-37, 2004 Missile Defense Agency, Advanced Applications Program, Reprint.
Rudmann et al., "Effects of NaF coevaporation on structural properties of Cu(In,Ga)Se$_2$ thin films," Thin Solid Films, 2003, 431-432:37-40.
Sakurai et al,. "Properties of Cu(In,Ga)Se2:Fe Thin Films for Solar Cells," Mater. Res. Soc. Symp. Proc., 2005, 865:F14.12.1-F.14.12.5.
Scofield et al., "Sodium diffusion, selenization, and microstructural effects associated with various molybdenum back contact layers for Cis-based solar cells," Proc. of the $24^{th}$ IEEE Photovoltaic Specialists Conference, New York, 1995, 164-167.

(56) References Cited

OTHER PUBLICATIONS

So et al., "Properties of Reactively Sputtered $Mo_{1-x}O_x$ Films," Appl. Phys. A, 1988, 45:265-270.
Sputtering Materials, Inc., www.sputteringmaterials.com/solar-products.html, "CIG and CIGS Products," Dec. 14, 2011, 1pg.
Stolt et al., "ZnO/CdS/$CuInSe_2$ thin-film solar cells with improved performance," Appl. Phys. Lett., Feb. 8, 1993, 62(6):597-599.
Tapphorn et al., "Kinetic Metallization: Application of Oxidation/Corrosion Resistant Coatings to Rocket Engine Combustion Chamber Liners," AeroMat 2004, Seattle, WA, Jun. 7-10, 2004.
Tapphorn et al., "Kinetic Metallization: Application of Alternative Sacrificial Anodic Coatings for Landing Gear and Aerospace Components," AeroMat 2004, Seattle, WA, Jun. 10, 2004.
Tapphorn et al., "Kinetic Metallization: Joining and Repair of Titanium Aircraft Structures," AeroMat 2004, Seattle, WA, Jun. 9, 2004.
Tapphorn et al., "Kinetic Metallization: Application of Alternative Wear-Resistant Metallic Coatings for Landing Gear and Aerospace Components," AeroMat 2004, Seattle, WA, Jun. 10, 2004.
WC-Co Hard Chrome Replacement, Tungsten Carbide-Cobalt (WC-Co), Inovati.com, 2012.
Windischmann, Henry, "Intrinsic Stress in Sputter-Deposited Thin Films," Critical Reviews in Solid State and Materials Science, 1992, 17(6):547-596.
Yun et al., "Fabrication of CIGS solar cells with a Na-doped Mo layer on a Na-free substrate," Thin Solid Films, 2007, 515:5876-5879.
Centerline®, SST™ Cold Spray Systems, Introducing the SST Series EP Cold Spray System, supersonicspray.com, Supersonic Spray Technologies Division, Copyright 2011, CenterLine (Windsor) Limited, 1 pg.
Atkinson, Helen, "Stirring Metals", Ingenia, Mar. 2006, 26:19-23.
Gabel, Howard, "Tech Spotlight: Kinetic Metallization Compared with HVOF," Adv, Mat. Proc., May 2004, 47-48.
MDA Technology Applications Report, "Coatings" 2004, 2 pages.
Semi-Solid Casting, 10 pages, http://iweb.tms.org/Communities/FTAttachments/Mg%20semi-solid%20%squeeze%20casting.pdf (date unknown).

\* cited by examiner

METHOD OF MAKING A CIG TARGET BY SPRAY FORMING

BACKGROUND

The present invention is directed to a method of making sputtering targets in general and to a copper indium gallium sputtering target and method of making thereof by spray forming in particular.

Sputtering techniques are useful in various ways, such as deposition processes used in the fabrication of various products. A component of such sputtering techniques is a sputtering target. In such deposition techniques, the material of the sputtering target is deposited onto a substrate.

SUMMARY

A method of making a sputtering target includes providing a backing structure, and forming a copper indium gallium sputtering target material on the backing structure by spray forming.

BRIEF DESCRIPTION OF THE DRAWINGS

FIG. 2b is a bottom view (i.e., a view from below) of the exemplary linear atomization process and apparatus of FIG. 2a, as viewed along the arrow A-A in FIG. 2a.

FIGS. 3a, 3b and 3c are SEM micrographs of spray formed 8.6Cu-72.5In-18.9 wt. % Ga alloy.

FIGS. 4a and 4b are SEM micrographs of spray formed 33.4Cu-52.8In-13.8 wt. % Ga alloy.

FIGS. 5a and 5b are SEM micrographs of spray formed 37.1Cu-52.3In-10.6 wt. % Ga alloy.

DESCRIPTION OF THE EMBODIMENTS

One consideration in selecting and developing sputtering targets is the material to be used in such sputtering targets. Various materials that initially appear to be attractive selections impose manufacturing challenges, particularly from a metallurgical standpoint and particularly when forming the material into a cylindrical or tubular shape. Another consideration is that many monolithic targets formed without a backing tube are not adequate to accommodate water cooling which is provided to the magnets and target assembly during a sputtering operation. Due to this, sputtering materials must often be either bonded to a backing tube or directly formed onto a backing tube, such as a backing tube made from stainless steel or other suitable material.

An exemplary sputtering technique is magnetron sputtering which utilizes magnetrons. Examples of such magnetron sputtering techniques, such as planar magnetron sputtering and rotary magnetron sputtering are discussed in U.S. Pat. No. 7,544,884, issued on Jun. 9, 2009, and which is hereby incorporated by reference in its entirety.

Rotary magnetron sputtering uses cylindrical sputtering targets that include a tube that forms the target material and at least one magnet located inside the tube. Due to the continuous displacement of the magnetic flux lines running through the tube wall as the tube is rotated around the magnets, circumferentially uniform erosion is achieved at the surface of the sputtering target. Such an erosion profile results in higher utilization of the target material in comparison to the erosion profiles provided by other sputtering techniques, such as those employing stationary, planar magnetrons.

One example of a sputtering application is the deposition of materials for solar cells. Copper indium selenide ("CIS") and copper indium gallium selenide ("CIGS") materials have been recognized as effective p-type solar cell absorber layer materials for the production of high efficiency, low cost, and large scale solar cells. Copper indium selenide and copper indium gallium selenide materials may be formed by a reactive sputtering from a copper indium or copper indium gallium ("CIG") sputtering targets, respectively, in a selenium containing ambient, such as selenium gas or hydrogen selenide gas.

According to an embodiment, a spray forming method is provided to produce a sputtering target. For example, the spray forming method (which is also referred to as atomization) can be used to spray a liquid or melted sputtering target material, such as, for example, a copper indium gallium ("CIG") alloy, directly onto a backing structure, such as a cylindrical backing tube.

CIG alloys possess a large freezing range, with a liquidus temperature over 500° C., often around 650° C., and a solidus temperature of below 160° C. A significant volume change is associated with the solidification and thermal contraction that often occurs over such a wide temperature range. Thus, a substantial amount of shrinkage occurs during conventional casting of such alloys. Sputtering targets, long in one dimension, having narrow sections and thin walled features, for example, can have porosity due to extensive solidification shrinkage. Inclusions and structural defects, such as porosity, are detrimental to sputtering processes, because such defects can cause arcing and electrical discharges that result in particle generation and the development of thin film anomalies. Phase heterogeneities, such as large areas of indium, can also be detrimental to the sputtering process, so it is desirable that the target material possess a fine-scale microstructure, which is obtained by employing sufficiently rapid cooling during solidification. In addition, large scale variations of composition within a target can lead to sputtered thin films of variable properties across their area and, as a consequence, reduced yield, so the method of CIG target production must limit the amount of macroscopic segregation of constituent elements. Commonly, manufacturing sputtering targets employs powder metallurgical processing, pressing atomized powder under a combination of temperature and/or pressure, for example, techniques, which tend to be expensive and laborious. In addition, it can be difficult to control the impurity content to low levels of sputtering target material made by powder processing methods.

Preferably, the CIG sputtering target material has a composition of about 29-41 wt % copper, including 29-39 wt % Cu, about 36-62 wt % indium, including 49-62 wt % In, and about 8-25 wt % gallium, including 16-25 wt % Ga. In another embodiment, the CIG sputtering target material has a composition of about 8-15 wt % copper, about 55-80 wt % indium, and about 10-25 wt % gallium. Preferably, the sputtering target material has an overall uniform composition, whereby the wt % of each of these 3 primary elements, of samples taken from any 2 random locations of the target, as determined by reliable analytical procedures of a material volume of at least 10 mm$^3$, does not vary relatively by more than 5%, and more preferably not more than 2%, and yet more preferably not more than 1%. Typically the microstructure of CIG consists of a Cu—Ga-rich intermetallic phase (or phases) in an indium-rich matrix. Depending primarily on the composition, the microstructure may contain additional minority phases, such as Cu, for example.

The sizes of the primary phase regions are determined using the planimetric technique described in section 12.5 of ASTM standard E1382-97 (2004) and using ASTM E562-08 to calculate volume fraction, in each case substituting primary phase "region" for "grain". Each primary phase "region" is defined as an entity visible in cross section under SEM with discernable boundaries and surrounded by the indium-rich matrix. In some cases, primary phase regions may have visible cracks but no matrix in the crack, in which case this is still counted as a single primary phase region. Preferably, between 0% and 10%, for instance 1% to 5%, of the primary phase regions (each comprising more than about 30 wt %, preferably more than 40 wt % copper) are of size greater than 30 μm in a random 1 cm by 1 cm area of the sputtering target. More preferably, between 0% and 10%, for instance 1% to 5%, of the primary phase regions are of size greater than 10 μm. Preferably, the average size of the primary phase region is no greater than 10 μm. More preferably, the average primary phase region size is 0.5 to 10 μm, such as 1 to 5 μm.

Preferably, the CIG sputtering target material has a density of 95% or more, as determined by the rule of mixtures applied to the densities of the component elements. The density determined this way can be greater than 100% due to the formation of an intermetallic compound with greater density than the pure elements. For example, the sputtering target material has a density of about 95 to 107%, such as 100 to 107%. Preferably, the average level of porosity in the CIG sputtering target material should be 0 to 12 vol %, as determined by microstructural image analysis of representative cross sections, for example. More preferably, the average level of porosity may be 0 to 7 vol %, such as 0.5 to 2.5 vol %. In addition, the CIG sputtering target material should not contain single inclusions or pores large enough to completely contain a 100 μm diameter sphere, preferably it should not contain single inclusions or pores large enough to completely contain a 50 μm sphere. In other words, single inclusions or pores, if present in the material, are small enough to only contain a sphere of less than 50 μm. Non limiting examples of single inclusions are foreign contaminants and/or oxide particles. In addition, the CIG sputtering target material should contain no pores or cracks having a distance of larger than 1000 μm when measured as straight linear distance between ends, more preferably not larger than 500 μm.

Figure 1:
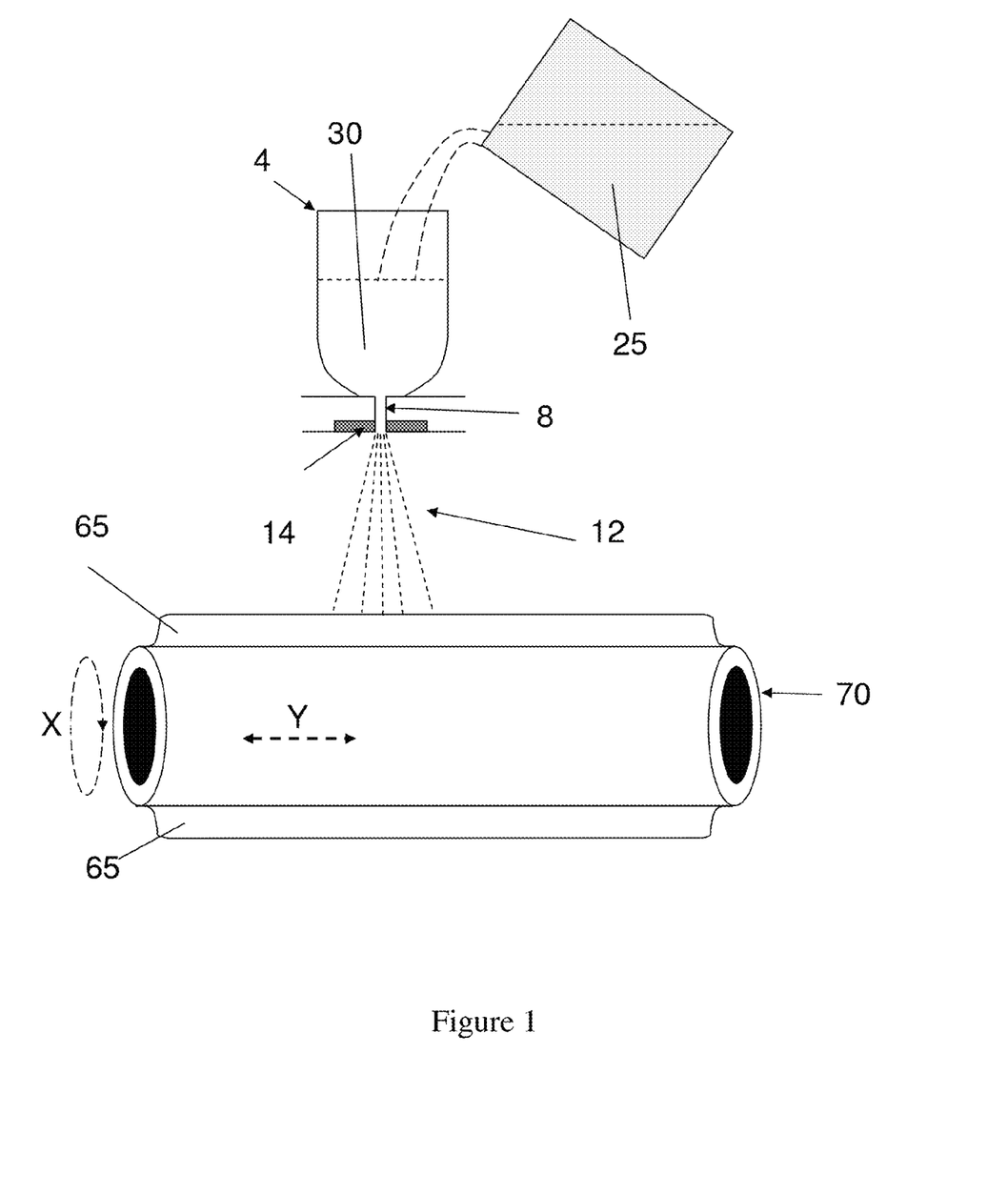
FIG. 1 is side view of an exemplary spray forming process and apparatus for forming a sputtering target.

Thus, according to an embodiment, a method of spray forming is provided to produce a sputtering target. In gas-atomized spray forming, a stream of molten CIG sputtering target material is provided by a crucible or tundish, which is then atomized by the impingement of high velocity inert gas jets, to form a spray, which is collected by a manipulated backing structure to build up a thick deposit, layer-wise as the spray is traversed numerous times, of the solid CIG sputtering target material on the backing structure, as shown in FIG. 1 for a tubular backing structure suitable for a rotary target. The total thickness of the sputtering target material can be controlled by the amount of melt deposited, resulting in a deposit that needs a minimum amount of machining to the precise dimensions required by the sputtering target. During spray forming, the heat of solidification is rapidly withdrawn from the molten CIG material by the gas, both before and after deposition, during flight of the spray droplets and on the top surface of the deposit. This enables the sputtering target material to be formed by rapid solidification of the liquid sputtering target material on the backing structure at a rate of greater than approximately 100° C./s. The resultant structure of the spray formed sputtering target material has many of the benefits of that conferred by powder metallurgical techniques, without the difficulties and extra process steps associated with powder handling, storage, classification and consolidation.

FIG. 1 shows an example of an assembly for producing a rotary sputtering target. In such an assembly, a crucible 25 can be provided to deliver molten sputtering target material 30 to a tundish 4 that has a nozzle 8 in the base. Alternatively, the molten material 30 may be delivered to the tundish via a conduit, such as a pipe, from a melt furnace. Alternatively, if sufficiently large, the tundish 4 may also act as a crucible, in which case the material 30 is delivered to the tundish 4 in the solid state and is then melted in the tundish 4, by a surrounding induction coil, for example. After the stream of molten sputtering target material has exited through the nozzle 8, it passes through the atomizer 14, whereby it is impacted and broken up by a concentric arrangement of gas jets (not shown) to produce a spray of metal droplets 12. The atomizer 14 can be of a close-coupled or a free-fall design.

The backing tube 70 is rotated and translated (backwards and forwards) by a manipulator, such as in the direction indicated by the arrows X and Y in FIG. 1, so that a coating 65 of sputtering target material with an even or uniform thickness is produced over the entire length of the backing tube 70. In another example, the profile of the sputtering material deposit 65 can be varied in the longitudinal direction of the backing tube 70 (e.g., the axial direction) by varying the translational speed during each cycle, so that there can be excess sputtering target material 65 in areas where there is preferential removal during sputtering processes.

It is preferred that the entire spray and deposition process is contained within an enclosed chamber, primarily to protect the spray and deposit from atmospheric contamination, such as oxidation, for example. In addition, the chamber aids the control of excess spray, overspray, and dust, preventing it from escaping into the surroundings. It is also preferred that the melting arrangement of crucible and tundish is enclosed by a chamber, also to protect the melt from atmospheric contamination. It is preferred that a vacuum can be achieved inside both spray and melt chambers and they can be back-filled with an inert gas, such as argon or nitrogen.

The temperature at the top surface of the deposit, around the point of deposition of the spray, is very important in determining the structure of the resultant sputtering target material. To a large, but limited extent, the temperature at the point of deposition is determined by the parameters employed for spray atomization, such as the melt temperature, the melt and gas flow rates, as examples, and the parameters employed for substrate manipulation, such as the spray distance and substrate transverse speed.

If the top surface around the point of deposition is too cold during spray forming, then the sputtering target material will solidify too quickly, the liquid will not flow enough and an excessive amount of porosity will be created. This situation normally occurs upon the initial passes of the spray on the backing structure if the backing structure is not pre-heated and the effective bond strength between the target material and the backing structure is low. Thus, it is preferred that the backing structure can be heated prior to spraying, so that the sputtering target material does not contain pores close to the backing structure and the bond strength is increased. The backing structure may be pre-heated by an external heating device, such as an electrical heater.

If the top surface around the point of deposition is too hot during spray forming, then the rate of sputtering target material solidification will be reduced and the phase structure will be coarsened, possibly with the formation of pores. Thus, it is preferred that the substrate manipulation system includes a method to cool the backing structure after the commencement of spraying, to prevent over heating of the deposit. A cooling method will also ensure that the entire sputtering target can be quickly returned to near ambient temperature after the termination of spraying, resulting in a short turn around time for efficient production.

For the example of the cylindrical backing tube, the backing structure/deposit temperature control may be provided by providing a cooling and/or heating device into the hollow interior of the tube. The cooling and/or heating device may comprise cooling or heating fluid conduit (such as a cold and/or hot water pipes), a resistive heater, inductive coils, etc. The provision of backing structure/deposit temperature control has the added advantage of being able to prevent deposit cracking that would otherwise be induced by differences in thermal contraction between the deposit and the backing structure.

Prior to spray forming, the surface of the backing structure to be deposited on to should be prepared so that the initial sprayed sputtering target material can adhere. For example, the backing structure surface may be roughened by a process such as grit blasting, for example, whereby an abrasive particulate, such as alumina, for example, is blasted at the surface using compressed air. It may be necessary to enhance the bond strength between the spray formed sputtering target material and the backing structure by increasing the roughness of the surface further, by coating the backing structure with any suitable thin, non-magnetic layer, applied by twin wire electric arc spray, for example, using parameters familiar to those skilled in the art.

One challenge with a spray forming technique is that it is difficult to ensure that the deposited sputtering target material is built up with a uniform structure. A traverse speed of the spray across the substrate that is too slow can cause excessive porosity in the target material, typically appearing as bands, due to problems associated with a deposition layer per spray pass that is too thick and/or deposition occurring on a top surface that is too cold. For a backing structure that is a tube, a substrate manipulation system both translates (along the axis of the tube) in a reciprocating manner and rotates the tube about its axis at speeds so that a thin layer is deposited on each pass and restrict the formation of such pores.

In an alternative embodiment, spreading of the deposition area over the backing structure, effectively increasing the backing structure traverse speed, can be increased for example, by scanning the spray, or by altering the atomizing gas flows or mechanical manipulation of the atomization die.

In another embodiment, to facilitate the deposition of a uniform deposit sputtering target material, a gas atomizer design is provided that generates a spray that is essentially or substantially planar. The spray produced by the gas atomizer can be arranged to have about the same length as the object to be coated (i.e., the difference in length is 0-10% for example). For example, when spraying atomized sputtering target material onto a backing structure, the length of the spray can be the length of the long dimension of the backing structure. In the case of spraying atomized sputtering target material onto a backing tube, the length of the spray can be the axial length of the tube.

When the spray is essentially planar and has about the same length as the backing structure, then the backing structure, such as a backing tube, need only be moved or rotated in a single direction relative to the spray to form a built up layer of evenly deposited target material. For example, a cylindrical backing tube can simply be rotated around its axis. For example, the spray of liquid material may be provided from a single, linear opening to cover the whole length of the backing tube. However, if desired, the spray may be provided from plural adjacent openings at the same time. Thus, the complexities associated with translating the backing tube at high speed are avoided and a simplified spray forming process can be provided that manufactures sputtering targets that are dense and homogeneous.

The arrangement of gas atomizing jets can be specifically designed to change properties of the spray, such as to change the size of the droplets of the spray, or the local melt flow rate, for example. In addition, the gas atomizing jets can be supplied with gas from independent sources to provide various spray conditions. For example, the gas atomizing jets can be altered such that a region at the center of a deposit formed by the metal spray is formed under relatively colder conditions than regions at the ends of the deposit formed by the metal spray, thus countering effects of external cooling of the deposit. As for a conventional spray forming arrangement, described previously, the jets may comprise any suitable gas that does not compromise the structure or composition, by the formation of oxides, for example, of the sputtering target material, such as argon, nitrogen, etc.

Figure 2A:
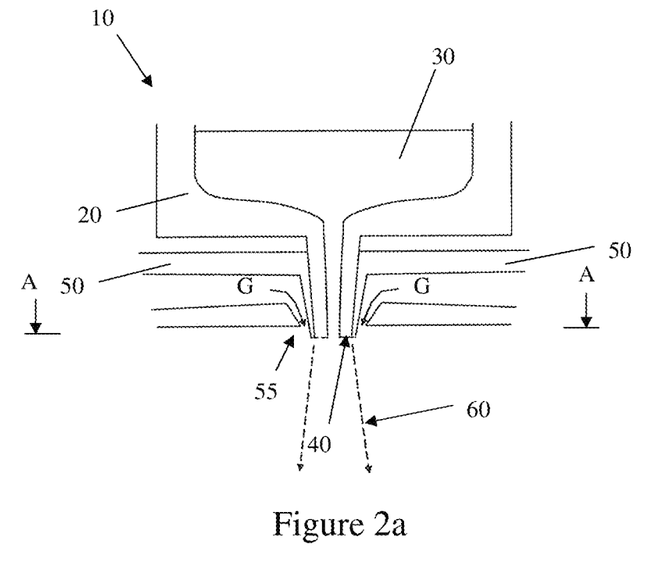
FIG. 2a is side view of an exemplary linear atomization process and apparatus for spray forming a sputtering target.
Figure 2B:
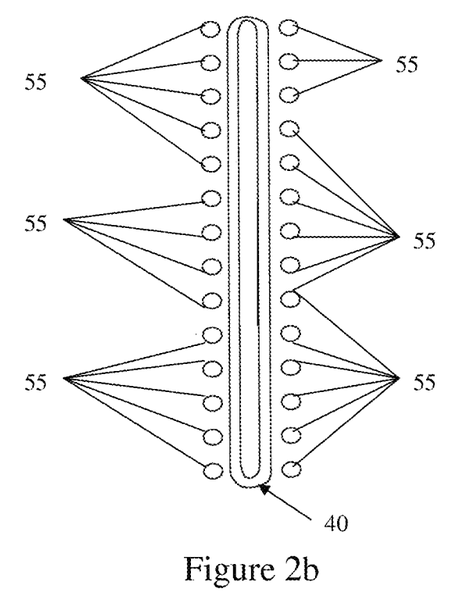

FIG. 2a shows an exemplary linear atomization assembly for spray forming 10 that includes a tundish 20. A source of molten sputtering target material (not shown in FIG. 2a) can be provided to deliver molten sputtering target material 30 (e.g., liquid CIG alloy) to the tundish 20. The tundish 20 can have a linear slot-like nozzle or opening 40 from which the molten sputtering target material 30 flows. An array of gas jets 55 can surround the nozzle 40 so that gas G supplied from a manifold 50 can exit the gas jets 55 and impact a stream of molten sputtering target material exiting the nozzle 40 of the tundish 20, producing a spray of sputtering target material droplets 60. The spray of droplets 60 can be deposited to form or build up a sputtering target, such as by building up the spray of solidified droplets, layer by layer, on a backing structure, such as a planar or rotary (e.g., tubular) backing structure. Such an atomizer could be either of a close-coupled or a free fall design. The axis of the spray 60 produced by the atomizer assembly can be essentially or substantially planar. Such profile can be provided by the shape of the tundish nozzle 40, which can be elongated in one direction to provide a slot-like opening, such as in the design shown in the example of FIG. 2b, and/or by the arrangement of gas jets 55 surrounding the nozzle opening 40.

Figure 2C:
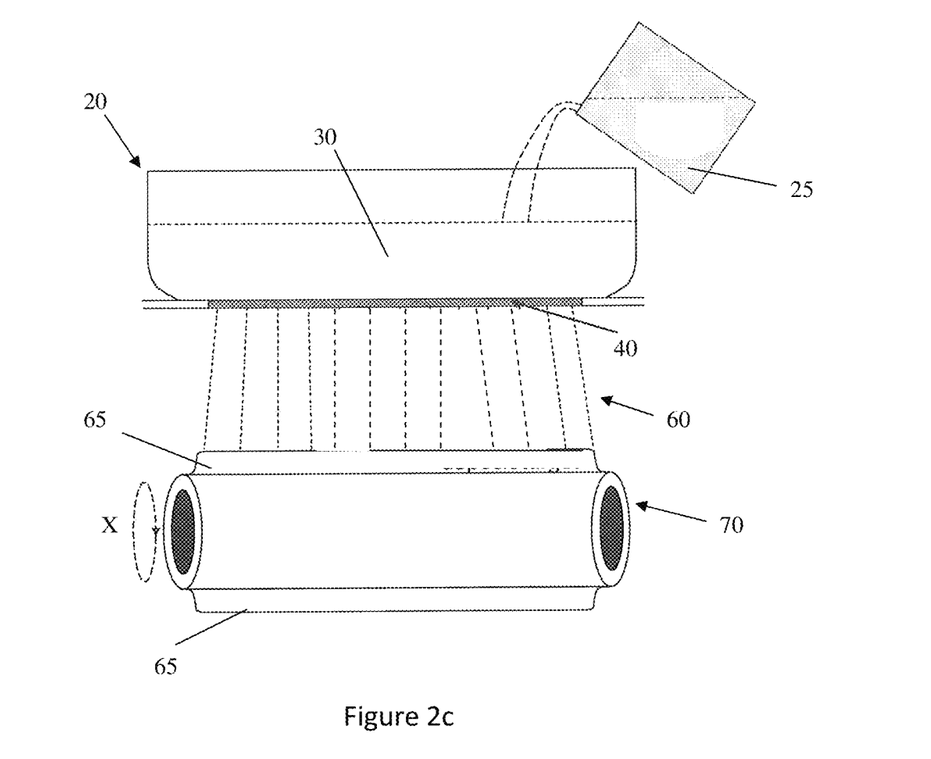
FIG. 2c is a side view of an exemplary linear atomization process and apparatus for spray forming a rotary sputtering target.

FIG. 2c shows an example of an assembly for producing a rotary sputtering target with a linear atomizer. In such an assembly, a crucible 25 can be provided to deliver molten sputtering target material 30 to a tundish 20 that has a nozzle 40. Alternatively, the molten material 30 may be delivered to the tundish via a conduit, such as a pipe, from a melt furnace. Alternatively, the tundish 20 may also act as a melt furnace, in which case the material 30 is delivered to the tundish 20 in the solid state and is then melted in the tundish. The nozzle 40 can have a linearly shaped slot, as discussed herein, and can be surrounded by gas jets (not shown in FIG. 2c) that deliver gas that impact the molten sputtering target material exiting the nozzle 40 to produce a spray of metal droplets 60. The spray of metal droplets 60 can then be deposited onto a backing tube 70 by aligning a long axis of the nozzle 40 with the long axis of the backing tube 70, as shown in the example of FIG. 2c.

The backing tube 70 can be rotated, such as in the direction indicated by arrow X in FIG. 2c, so that a coating 65 of sputtering target material with an even or uniform thickness is produced over the entire length of backing tube 70. The backing tube 70 can be advantageously rotated without additional translation of the backing tube 70, such as without translating the backing tube 70 in the direction of the long axis of the backing tube 70 in relation to the spray of metal droplets 60.

In another example, the deposition profile of the metal spray 60 can be varied in the longitudinal direction of the backing tube 70 (e.g., the axial direction) by varying a width of the nozzle or opening 40 of the spray/atomization device. For example, the profile of the metal spray 60 can be varied in the longitudinal direction to deposit excess sputtering target material 65 in areas where there is preferential removal during sputtering processes. Thus, the width of the nozzle or opening 40 in the tundish 20 is wider in regions which overlying the portions of the target requiring excess target material 65.

The assembly for producing a rotary sputtering target by spray forming using a linear atomization arrangement does not require equipment to translate a backing tube 70 in addition to equipment to rotate the backing tube 70. This simplifies the design and fabrication of the assembly, particularly if the assembly includes heating and/or cooling equipment. The simplification of the design of the assembly also results in a smaller effective size of the overall assembly, which in turn reduces the overall size of a spray forming chamber for the assembly, such as when the spray forming apparatus is provided within a chamber to provide a controlled environment, such as a vacuum or an inert gas (e.g., argon) atmosphere.

In an example of the present embodiment, a mixture of metals and/or metal alloy(s), such as, for example, a CIG alloy, is melted in a vessel to provide a uniform composition. In another example, the molten material supply may be manipulated such that one or more elements in the melt (e.g., Cu, In, Ga, Na, Zn and/or Al) has a controlled composition gradient with respect to the space of the melt. Such a gradient permits flexibility with the variables of the spray forming process. For example, sodium may be added to the copper indium gallium melt.

One or more elements may be added to the melt, such as by a continuous or batch metering device, to provide a changing gradient of composition within the geometry of the melt. In other words, the composition of the melt 30 (in FIGS. 1 and 2c) may be non-uniform in the vertical direction in the tundish 4 or 20. Alternatively, the melt 30 of one composition may be completely discharged from the tundish 4 or 20 followed by filling the tundish with a melt of a different composition.

By using the spray forming methods described herein, a sputtering target is produced with a high density, low porosity, a composition with a high uniformity and a fine scale microstructure.

The spray forming method is flexible in that the melt temperature, nozzle sizes and geometries, melt flow rate, atomizer designs and geometries, gas flow rates, gas temperatures, melt chamber geometry, backing structure thermal management, and motion of the backing structure can all be controlled to achieve a desired solidification rate of the droplets during flight and after deposition. If necessary, the resulting combination of backing structure and coating may then be subjected to post-process treatment, such as treatments under relatively higher temperatures and pressure to change the coating structure. For example, the spray formed sputtering target material maybe sheared, using an extrusion press and die arrangement, to close any residual porosity. For example, such processes can use a controlled temperature gradient, such as to tailor the temperature profile normal to the plane of the coating, such as to preferentially induce changes near the coating/substrate interface. Post-deposition processing can include other processes, such as, for example, abrasive, ablative, or electrolytic removal of an outer layer of the coating material, and other processes used in the art.

While a rotary (i.e., tubular) target was described above, it should be noted that other target shapes may be formed. For example, a planar target may be formed instead by using a planar backing structure in the methods of FIG. 1 or FIG. 2C. The planar backing structure may be translated in two dimensions or one dimension in the methods of FIGS. 1 and 2C, respectively.

It is to be understood that the present invention is not limited to the embodiment(s) and the example(s) described above and illustrated herein, but encompasses any and all variations falling within the scope of the appended claims. While a pure CIG alloy is described above, it should be noted that the CIG alloy may contain other alloying elements. For example, the alloy may contain Na, Al, S and/or Se in addition to copper, indium and gallium. For example, the CIG alloy melt may comprise a Na-containing material such that it contains 0.01 wt % to 10 wt % Na, for example 0.1 wt % to 1.0 wt %. The sodium-containing material may comprise any material containing sodium, for example metallic sodium or alloys or compounds of sodium with one or more of selenium, sulfur, oxygen, nitrogen or barrier metal (such as molybdenum, tungsten, tantalum, vanadium, titanium, niobium or zirconium), such as sodium fluoride, sodium molybdate, sodium fluoride, sodium selenide, sodium hydroxide, sodium oxide, sodium sulfate, sodium tungstate, sodium selenate, sodium selenite, sodium sulfide, sodium sulfite, sodium titanate, sodium metavanadate, sodium orthovanadate, or combinations thereof. Alloys or compounds of lithium and/or potassium may be also used, for example but not limited to alloys or compounds of lithium or potassium with one or more of selenium, sulfur, oxygen, nitrogen, molybdenum, tungsten, tantalum, vanadium, titanium, niobium or zirconium.

Additional elements can also be incorporated into the spray formed CIG target by introducing particulate (i.e., solid particles) into the liquid spray so as to create a substantially homogenous distribution of particles within the target. This is achieved by seeding a secondary gas flow with particles and injecting them at a point, or points, close to the atomization die on the axis of the spray. Typically, the injection needs to be symmetrically arranged, or in an annulus, around the spray axis to ensure an even distribution of the particulate. The particulate can be of any material. For example, if Na is to be added to the target, the particulate can be a Na-containing compound, such as a Na-containing salt, such as NaCl.

Figure 3A:
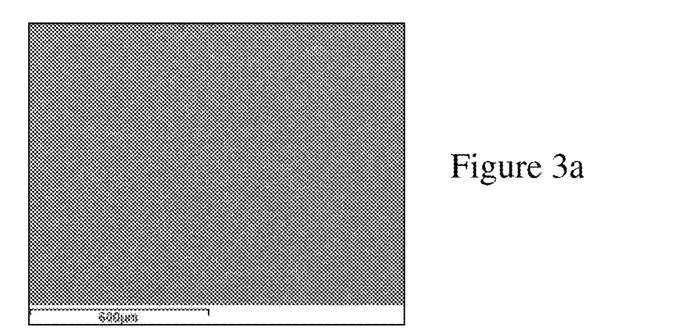
FIG. 3a is a low magnification micrograph showing minimal porosity.
Figure 3B:
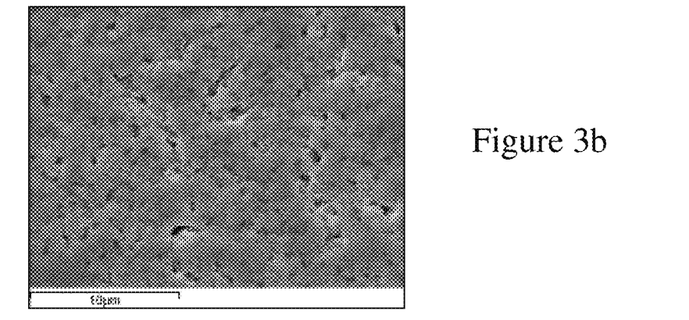
FIG. 3b is a higher magnification micrograph showing a fine, intimate microstructure consisting primarily of $Ga_2Cu$ and In phases.
Figure 3C:
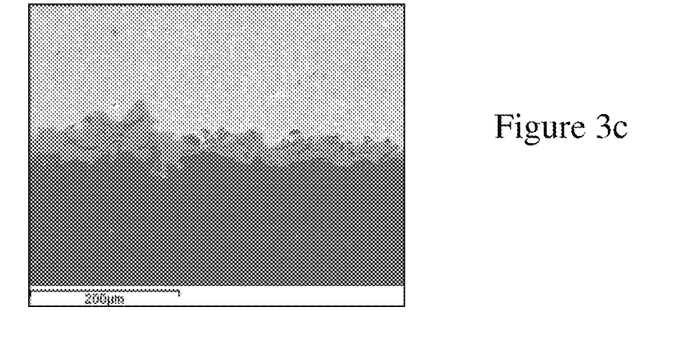
FIG. 3c is an intermediate magnification micrograph showing an Al-bronze bond coat between the spray formed CIG and a stainless steel backing tube.
Figure 4A:
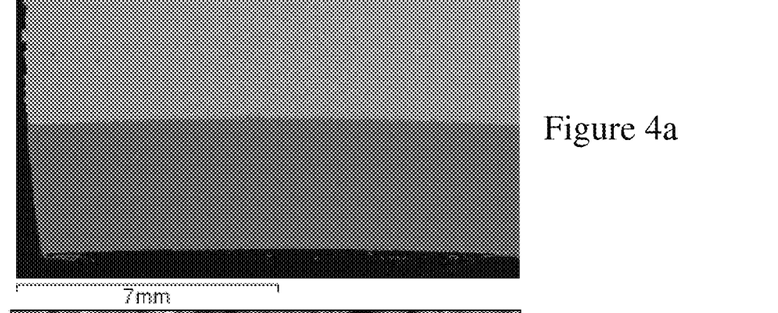
FIG. 4a is a low magnification micrograph showing the entire thickness of a low porosity CIG deposit on a stainless steel backing tube.
Figure 4B:
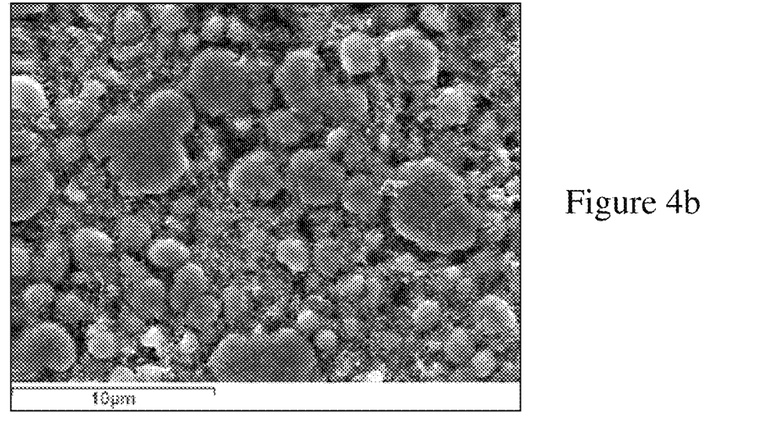
FIG. 4b is a higher magnification micrograph showing a fine microstructure consisting primarily of $Cu_9(In,Ga)_4$ and In phases.
Figure 5A:
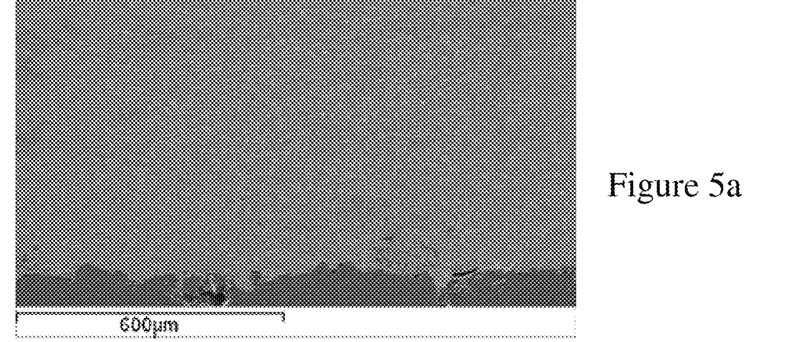
FIG. 5a is a low magnification micrograph showing the entire thickness of a low porosity deposit on an aluminum backing tube.
Figure 5B:
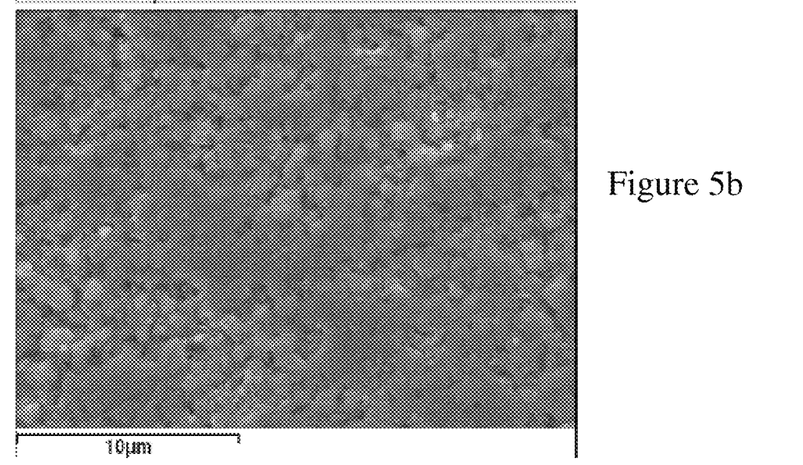
FIG. 5b is a higher magnification micrograph showing a fine microstructure consisting primarily of $Cu_9(In,Ga)_4$ and In phases.

FIGS. 3a-3c, 4a-b and 5a-b are SEM micrographs of various exemplary spray formed CIG alloys. FIGS. 3a-3c are micrographs of a low Cu content CIG alloy (8.6Cu-72.5In-18.9 wt. % Ga) spray formed on an Al-bronze bond coat on a steel backing tube. FIGS. 4a and 4b are micrographs of an intermediate Cu content CIG alloy (33.4Cu-52.8In-13.8 wt. % Ga alloy) spray formed on a stainless steel backing tube. FIGS. 5a and 5b are micrographs of a high Cu content CIG alloy (37.1Cu-52.3In-10.6 wt. % Ga) spray formed on an aluminum backing tube.

The preceding description of the disclosed embodiments is provided to enable any person skilled in the art to make or use the described embodiment. Various modifications to these embodiments will be readily apparent to those skilled in the art, and the generic principles defined herein may be applied to other embodiments without departing from the scope of the disclosure. Thus, the present invention is not intended to be limited to the embodiments shown herein but is to be accorded the widest scope consistent with the following claims and the principles and novel features disclosed herein.

What is claimed is:

1. A method of making a sputtering target, comprising:
providing a backing structure, and
forming a copper indium gallium sputtering target material on the backing structure by spray forming wherein:
from 0% to 10% of primary phase regions in the sputtering target material are of a size greater than 30 µm in any random 1 cm by 1 cm area of the sputtering target;
an average primary phase region in the sputtering target material is of a size not greater than 10 µm; and
the sputtering target material has an overall uniform composition.

2. A method as claimed in claim 1, wherein the sputtering target material is provided in a liquid state from a tundish into at least one gas jet to create a liquid droplet spray.

3. A method as claimed in claim 2, wherein the sputtering target material is formed by spraying the entire sputtering target material directly onto the backing structure having a planar shape.

4. A method as claimed in claim 2, wherein the sputtering target material is formed by spraying the entire sputtering target material directly onto the backing structure comprising a cylindrical backing structure to form a rotary sputtering target.

5. A method as claimed in claim 4, wherein the sputtering target material droplet spray is provided onto the cylindrical backing structure that is rotated about its axis and moved parallel to its axis.

6. A method as claimed in claim 4, wherein the sputtering target material droplet spray is provided from the tundish through a slit shaped opening having about a same length as an axial length of the cylindrical backing structure.

7. A method as claimed in claim 6, wherein the sputtering target material droplet spray provided from the tundish has about the same length as the axial length of the cylindrical backing structure.

8. A method as claimed in claim 6, wherein the cylindrical backing structure rotates about its axis but is not moved along its axis while the sputtering target material droplet spray is provided onto the backing structure.

9. A method as claimed in claim 6, wherein the slit shaped opening has a variable width such that more sputtering target material is deposited on the backing structure at a location corresponding to a wider opening width than at a location corresponding to a narrower opening width.

10. A method as claimed in claim 2, further comprising heating the backing structure before the sputtering target material droplet spray is provided onto the backing structure.

11. A method as claimed in claim 2, further comprising cooling the backing structure at least one of during and after the sputtering target material droplet spray is provided onto the backing structure.

12. A method as claimed in claim 2, wherein the liquid sputtering target material is provided from the tundish in a controlled environment.

13. A method as claimed in claim 2, wherein the sputtering target material droplet spray and the backing structure are contained within a controlled environment.

14. A method as claimed in claim 2, further comprising adding metallic sodium or a sodium compound to the liquid copper indium gallium sputtering target material.

15. A method as claimed in claim 2, further comprising providing solid particles into the liquid droplet spray.

16. A method as claimed in claim 15, wherein the solid particles comprise sodium containing particles which are provided into the spray to create a substantially homogenous distribution of sodium containing particles within the target.

17. A method as claimed in claim 1, wherein the sputtering target material has an overall uniform composition of about 29-41 wt % copper, about 36-62 wt % indium, and about 8-25 wt % gallium.

18. A method as claimed in claim 1, wherein the sputtering target material has an overall uniform composition of about 8-15 wt % copper, about 55-80 wt % indium, and about 10-25 wt % gallium.

19. A method as claimed in claim 1, wherein the sputtering target material is formed by rapid solidification of the liquid sputtering target material on the backing structure at a rate of approximately 100° C./s, or greater.

20. A method as claimed in claim 1, wherein the target material further comprises a metallic Na or Na-containing compound, and the target material contains 0.1 wt % to 1.0 wt % Na.

21. A method of making a sputtering target, comprising:
providing a backing structure, and
forming a copper indium gallium sputtering target material on the backing structure by spray forming, wherein:
from 0% to 10% of primary phase regions in the sputtering target material are of a size greater than 10 µm in any random 1 cm by 1 cm area of the sputtering target;
an average primary phase region in the sputtering target material is of a size between 0.5 and 10 µm; and
the sputtering target material has an overall uniform composition.

22. A method of making a sputtering target, comprising:
providing a backing structure, and
forming a copper indium gallium sputtering target material on the backing structure by spray forming, wherein:
from 1% to 5% of primary phase regions in the sputtering target material are of a size greater than 10 µm in any random 1 cm by 1 cm area of the sputtering target;
an average primary phase region in the sputtering target material is of a size between 1 and 5 µm; and
the sputtering target material has an overall uniform composition.

* * * * *